United States Patent
Ho et al.

(10) Patent No.: US 7,564,162 B2
(45) Date of Patent: Jul. 21, 2009

(54) PROCESS COMPENSATED MICROMECHANICAL RESONATORS

(75) Inventors: Gavin Kar-Fai Ho, Cambridge, MA (US); Farrokh Ayazi, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 37 days.

(21) Appl. No.: 12/001,341

(22) Filed: Dec. 11, 2007

(65) Prior Publication Data

US 2008/0143217 A1 Jun. 19, 2008

Related U.S. Application Data

(60) Provisional application No. 60/869,821, filed on Dec. 13, 2006.

(51) Int. Cl.
*H02N 2/00* (2006.01)

(52) U.S. Cl. .................... 310/309; 333/186

(58) Field of Classification Search ........ 310/309; 333/186, 188, 200; 73/504.03, 504.12, 504.14, 73/514.32, 514.37, 514, 38, 862.59
See application file for complete search history.

(56) References Cited

U.S. PATENT DOCUMENTS

| 5,396,066 A | * | 3/1995 | Ikeda et al. | 250/306 |
| 2006/0125576 A1 | * | 6/2006 | Ho et al. | 333/186 |

* cited by examiner

*Primary Examiner*—Thomas M Dougherty
(74) *Attorney, Agent, or Firm*—Kenneth W. Float

(57) ABSTRACT

Disclosed are micromechanical tapered I-shaped bulk acoustic resonators. An exemplary resonator is formed on a substrate, which is preferably silicon. The resonator has a central rod (or extensional member) coupled to two tapered lateral flanges (or flexural members). The central extensional member and tapered flexural members are separated from the substrate. One or more electrodes are disposed adjacent to the tapered flexural members, are separated therefrom by small gaps, and are separated from the substrate. One or more anchors are coupled to the substrate, are laterally separated from the central rod by small gaps, and are coupled to the central rod by supports. The one or more anchors support and suspend the central rod and flexural members from the substrate. Process compensation is achieved using the tapered flexural members.

4 Claims, 5 Drawing Sheets

$L_e$ = Electrode length
$L_f$ = Flange length
$w_f$ = Flange width
$L_r$ = Rod length
$w_r$ = Rod width
$t_r$ = Thickness

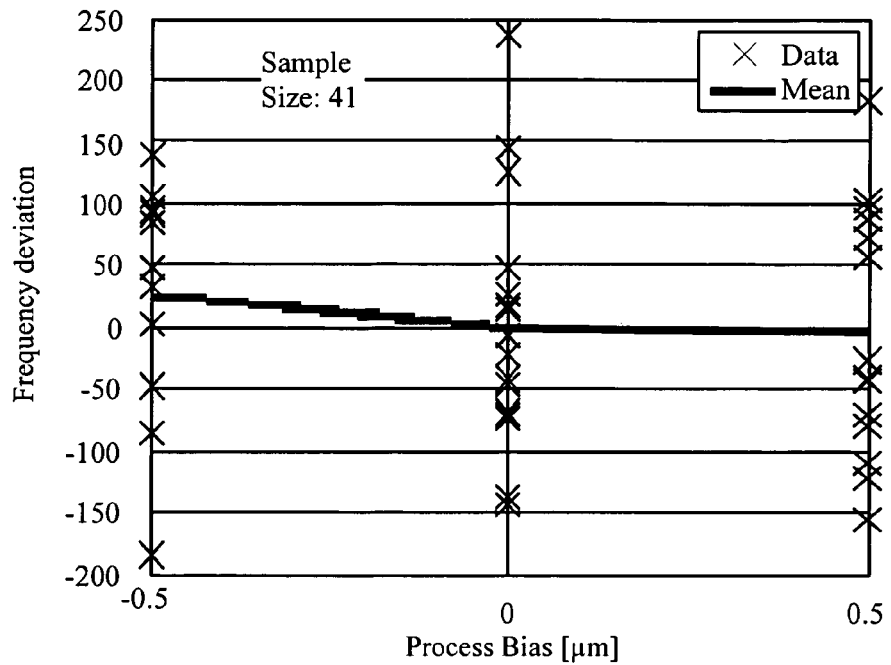
Fig. 9
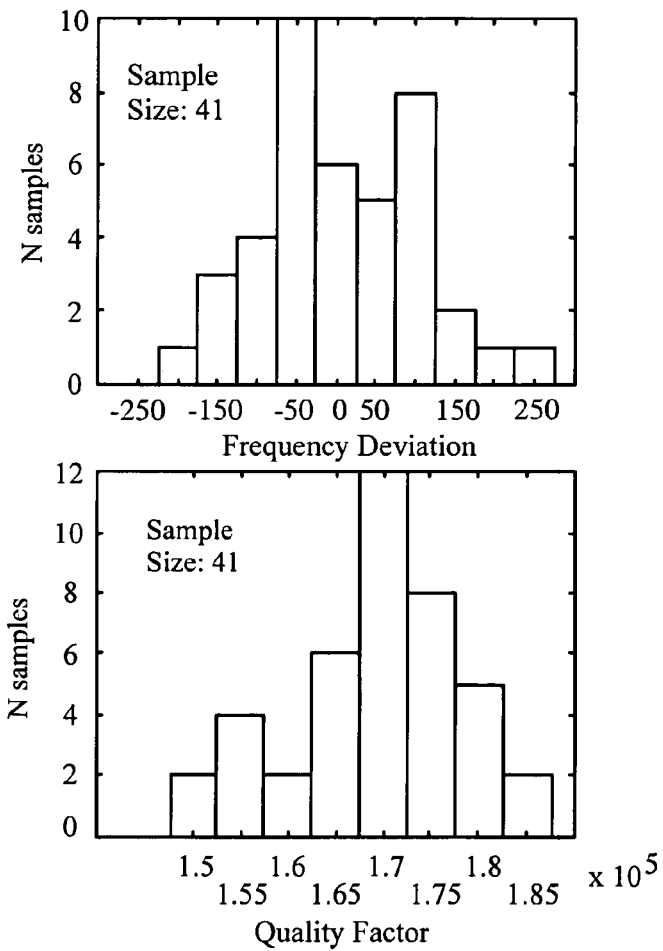
Fig. 10
Fig. 11

PROCESS COMPENSATED MICROMECHANICAL RESONATORS

This application claims the benefit of U.S. Provisional Application No. 60/869,821, filed Dec. 13, 2006.

BACKGROUND

The present invention relates to micromechanical I-shaped bulk acoustic resonators (IBARs).

Micromechanical resonators are strong candidates to complement quartz technology in frequency references. Frequency accuracy is a key technological hurdle that must be addressed. Deviations in center frequency can be attributed to material properties and geometry. To address this issue, center frequency trimming by iterative laser ablation and by selective deposition have been proposed. Individually-programmed synthesizers utilizing fractional-N phase lock loops (PLLs) have also been demonstrated. However, a design for manufacturability (DRM) technique employing batch compensation would address the issue at its roots.

The material properties must be consistent and repeatable to enable DFM. Single-crystal silicon (SCS) is the choice material since it is the best controlled and most characterized. Its ideal crystalline nature also has potential for very high Q and minimal aging. For reference, quartz crystal units typically have absolute frequency tolerances up to ±20 ppm. Hence, the applicability of micromechanical resonators is contingent on meeting similar performance metrics.

It would be desirable to have improved micromechanical resonators and fabrication methods. In particular, it would be desirable to have improved micromechanical tapered I-shaped bulk acoustic resonators.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 9 is a graph showing measured frequency deviation from the ideal design and designs with deliberately drawn bias;

FIG. 10 shows a histogram of resonator frequencies; and

FIG. 11 shows a histogram of resonator Q.

DETAILED DESCRIPTION

Figure 1:
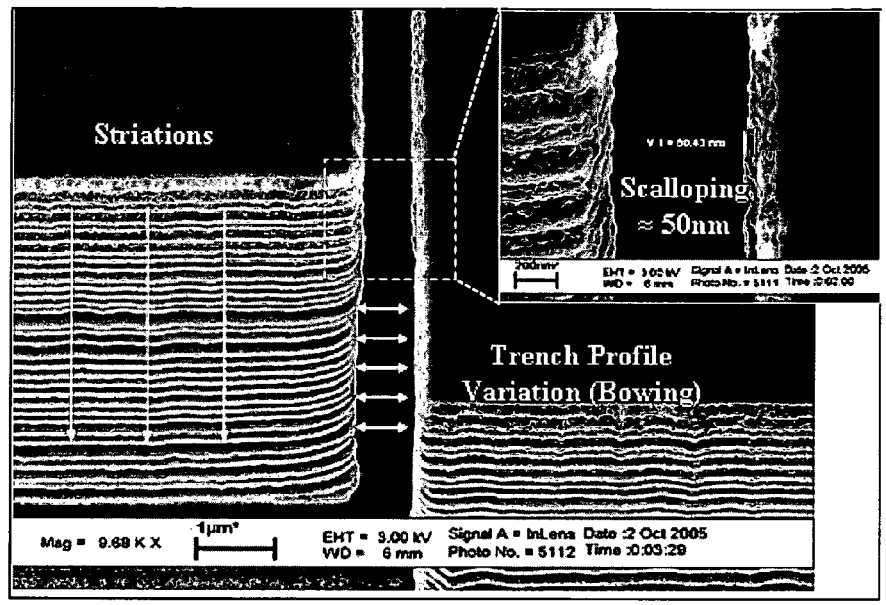
FIG. 1 illustrates a SEM view of a typical 10 μm DRIE trench in a SOI substrate.

Referring to the drawing figures, disclosed are process compensated micromechanical resonators 10, whose center frequency is robust to dimensional variations caused by lithography and micromachining. Exemplary embodiments of the process compensated micromechanical resonators 10 comprise tapered I-shaped bulk acoustic resonators 10.

The exemplary resonators 10 described herein may be fabricated using fabrication processes described in U.S. application Ser. No. 11/251,197, filed Oct. 15, 2005, for example, the contents of which are incorporated herein by reference in their entirety.

Figure 3:
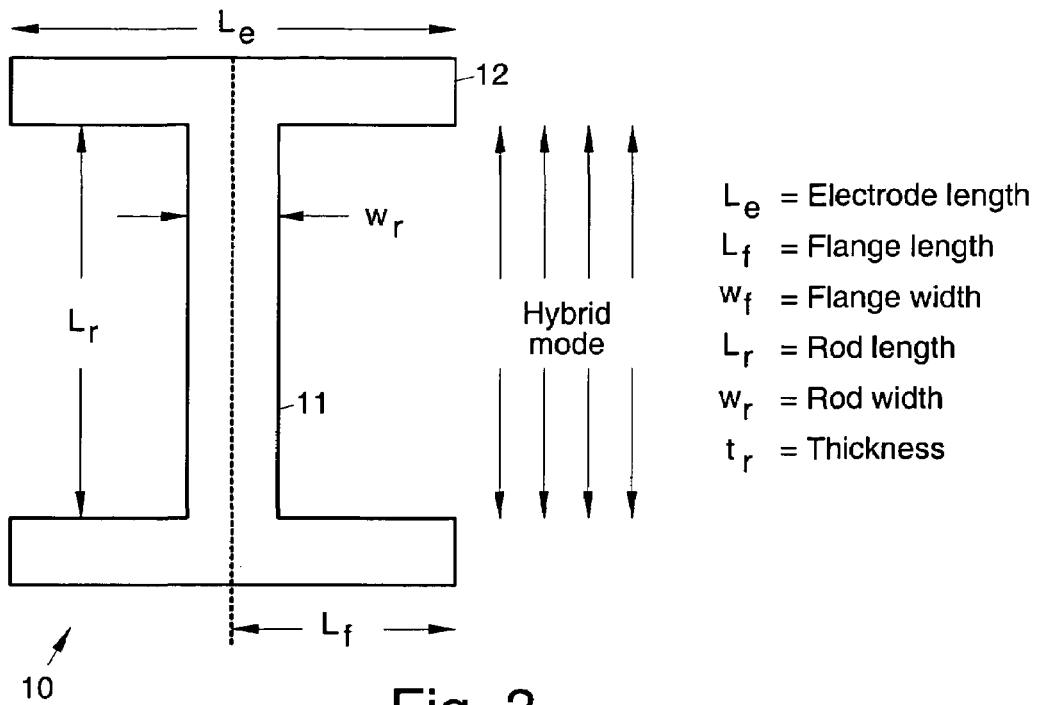
FIG. 3 illustrates the geometry of an exemplary IBAR.

In developing the improved resonators 10, non-idealities of silicon bulk micromachining of a typical conventional resonator shown in FIG. 1 are analyzed along with their effects on resonator characteristics. FIG. 3 shows the geometry of an exemplary I-shaped bulk acoustic resonator (IBAR). A very simple lumped model of an IBAR is disclosed with reference to FIGS. 4a and 4b. Process compensation techniques for exemplary IBARs are discussed and validated using finite element simulations. Experiments and verification of the process compensation scheme are discussed.

Silicon Micromachining and Process Compensation

High performance capacitive resonators must have a large transduction area. This requirement calls for deep reactive ion etching (DRIE) of thick resonators whether trenches are used for transduction or are used to define sacrificial gaps. In trench etching, non-idealities such as scalloping, striations, bowing, and footing exist, as is illustrated in FIG. 1. The first three phenomena are generally random and are typically within 50 nm. In optimized processes, footing can be avoided and random non-idealities are further reduced.

Lithography and pattern transfer issues account for the majority of micromachining variations. These limit the dimensional accuracy which generally compromises center frequency accuracy. Although these variations are temporally random, they are spatially systematic.

Process compensation with regard to the center frequency is conceptually straightforward. Since critical dimension (CD) variations lead to deviations from the modal stiffness k and mass m, the process-compensated design ensures that variations in k are proportional to variations in m, thus maintaining a constant $f_n$, given by $$f_n = 1/2\pi \sqrt{k/m}. \qquad (1)$$

Resonator Design and Modeling

A simple lumped mechanical model of the IBAR 10 is discussed below. Three categories of IBARs 10, including Q-enhanced (QE), compliance-enhanced (CE), and semi-compliant high-Q (CQ) IBARs 10, are discussed and contrasted. A 10 MHz optimized semi-compliant high-Q IBAR 10 is detailed and its frequency-sensitivity is modeled.

Figure 2:
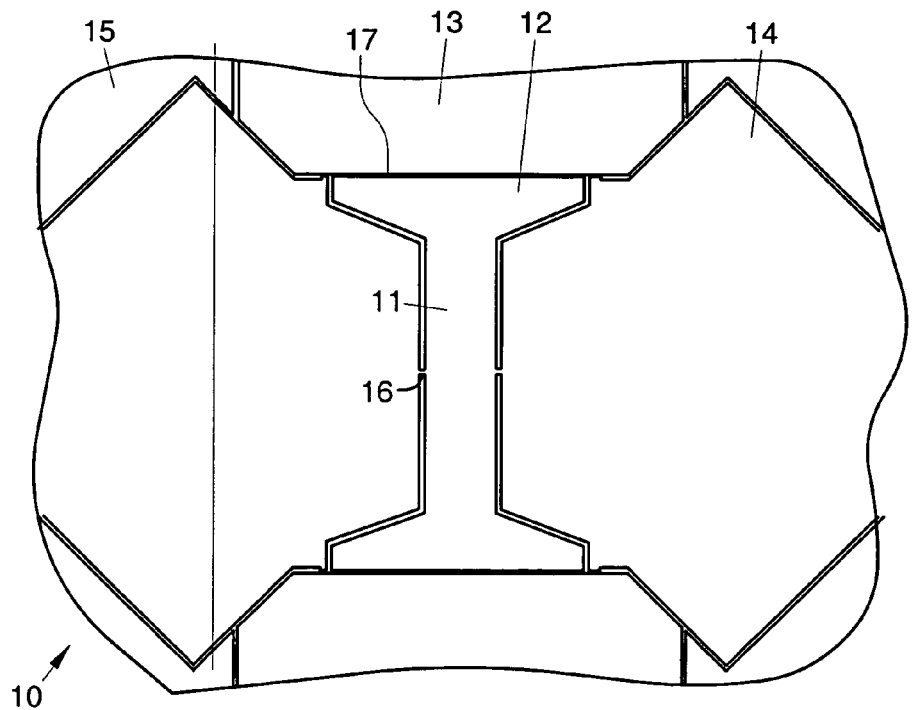
FIG. 2 illustrates a SEM view of an exemplary DFM-optimized 10 MHz IBAR.

FIG. 2 illustrates an exemplary IBAR 10. The IBAR 10 is formed on a substrate 15, which is preferably a silicon substrate 15. The IBAR 10 has a central rod 11 (or extensional member 11) coupled to two tapered lateral flanges 12 (or flexural members 12). The central extensional member 11 and tapered flexural members 12 are separated (released) from the substrate 15. One or more electrodes 13 are disposed adjacent to the tapered flexural members 12, are separated therefrom by small gaps 17, and are separated (released) from the substrate 15. One or more anchors 14 are coupled to the substrate 15, and are coupled to the central rod 11 by supports 16. The one or more anchors 14 function to support and suspend the central rod 11 and flexural members 12 from the substrate 15. The supports 16 are placed in such a way to minimize acoustic loss to the substrate 15 and enable maximum Q. The extensional member 11, the tapered flexural members 12, the anchors 14, and the supports 16 are preferably made of low-resistivity single crystal silicon (SCS). The electrodes 13 are preferably LPCVD trench-refilled doped polysilicon. Various parameters are shown in FIG. 3, including electrode length, flange length, flange width, rod length rod width and thickness.

A preferred method of fabricating the resonator 10 begins with a singly crystal silicon (SCS) layer on an insulating oxide layer on a substrate 15, otherwise known as a silicon-on-insulator (SOI) substrate 15. Trenches are etched in the SCS layer to define the tapered lateral flanges 12 (tapered flexural members 12), the rod 11 (or extensional member 11), and the supports 16. A thin sacrificial oxide layer is then grown or deposited and the trenches are refilled with polysilicon to form the electrodes 13. The polysilicon is patterned to define pads for the electrodes 13. Parts of the SCS layer are etched and the resonator 10, anchors 14, supports 16, and silicon pads are defined. By etching the sacrificial oxide and insulating layer, the resonator 10 becomes released with gap 17 formed between the tapered lateral flanges 12 and the electrodes 13 and is suspended above the substrate 15.

Figure 4A:
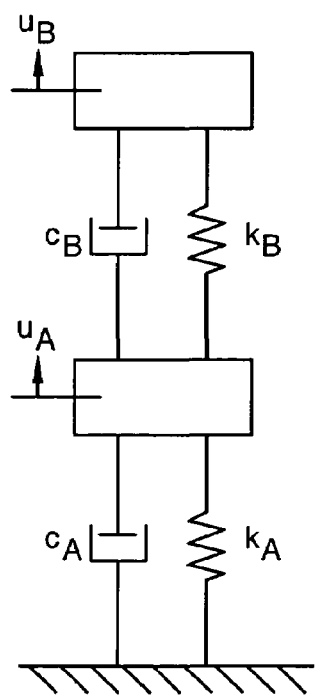
FIG. 4 illustrates a lumped 2DOF ¼-model of an exemplary IBAR.
Figure 4B:
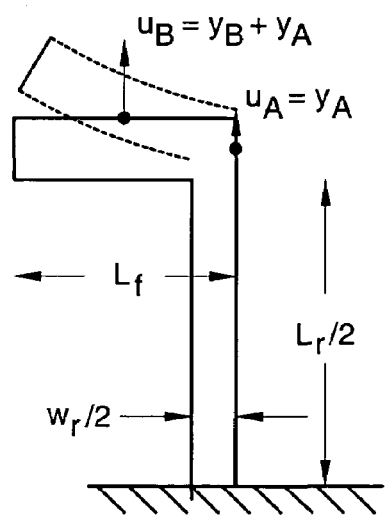

A simple two degree-of-freedom system is shown in FIGS. 4a and 4b that may be used to analyze the IBAR 10. The model includes an extensional component (rod 11) and a flexural component (flanges 12). Damping in the model is assumed to be intrinsic (i.e., by material losses and not air damping or anchor loss) and proportional to velocity. The coupled two degree-of-freedom system includes lumped parameters $m_i$, $k_i$, and $c_i$ for I=A, B, which are derived from parameters of constituent components. Local coordinates $y_i$ model local displacements of each component and $u_i$ represent global displacements.

The three categories of IBARs 10 may be described using FIGS. 4a and 4b. The eigenvalue problem describing the 2 degree-of-freedom system yields eigenvectors (i.e., mode shapes) that are dependent on the lumped parameters. The system can have two modes. The mode of interest is the lower frequency mode in which mass elements are in phase. For the sake of brevity, the three classifications are described without mathematical detail.

For the case in which $k_B$ is very large, the mode is predominantly in extension of the rod (i.e. $y_B << y_A$). The mass $m_B$ can be viewed as a mass-loading energy storage element. If losses in the system are entirely intrinsic, increasing $m_B$ actually increases the quality factor. IBARs 10 with this characteristic are the Q-enhanced (QE) class. Although Q is greater than a uniform extensional rod, the f·Q product remains constant.

At the other extreme, $k_B$ is small and $y_B$ is dominant. For this case, the stiffness, Q, and natural frequency of the IBAR 10 are solely defined by the flexural flange 12. These are compliance-enhanced (CE) IBARs 10 since the stiffness is low in comparison to a purely extensional mode. Compliance enhancement leads to reduced motional impedance and high electrostatic tuning.

The semi-compliant high-Q (CQ) IBAR 10 combines the attractive features of both extreme topologies. These structures have reduced stiffness and enhanced Q. It will be shown that the semi-compliant high-Q (CQ) IBAR 10 is also ideal for DFM.

Q-Enhanced (QE) IBAR DFM

Figures 5A, 5B:
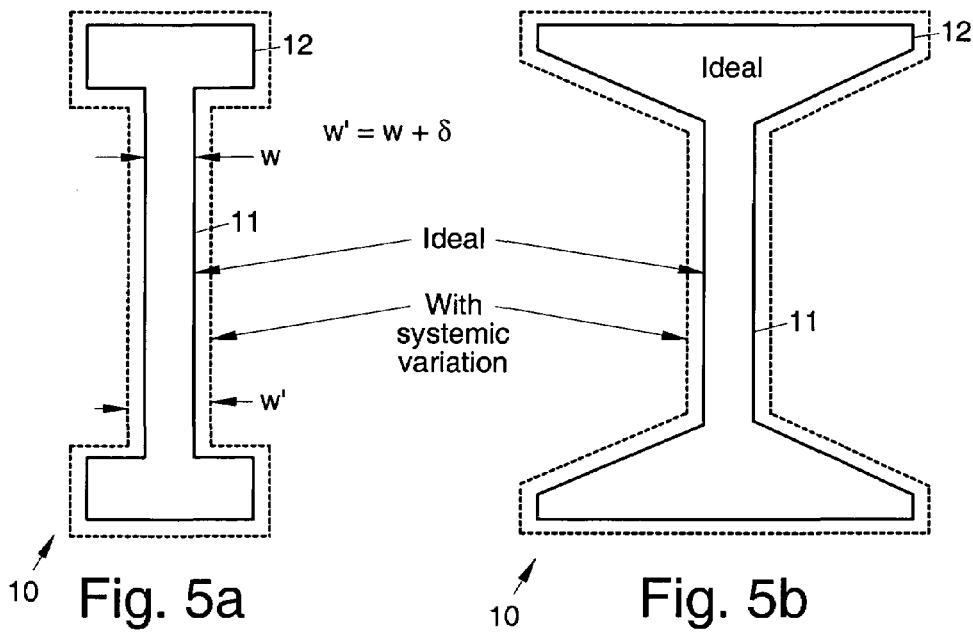
FIGS. 5a and b illustrates dimensional dependency on trench width for a QE IBAR and a CE IBAR, respectively.

The geometry of a Q-enhanced (QE) IBAR and the dependence of its geometry on systematic process variations is shown in FIG. 5a. Process bias δ due to $DR_rIE$ trench width variation affects all features equally. For a process-compensated design, the gradient of natural frequency on process bias is ideally zero. Using the crude two degree-of-freedom model, the natural frequency of a Q-enhanced (QE) IBAR 10 is sqrt($k_A/(m_A+m_B)$). For $w=w_f$, the zero-frequency-sensitivity problem is solved for $L_r/L_f=4$. A ratio of 4 is a typical lower limit. If flexing or shearing is considered in the model, the ratio is greater. Thus, the half-length of the electrode is less than ¼ of the length of the rod 11.

Figure 6:
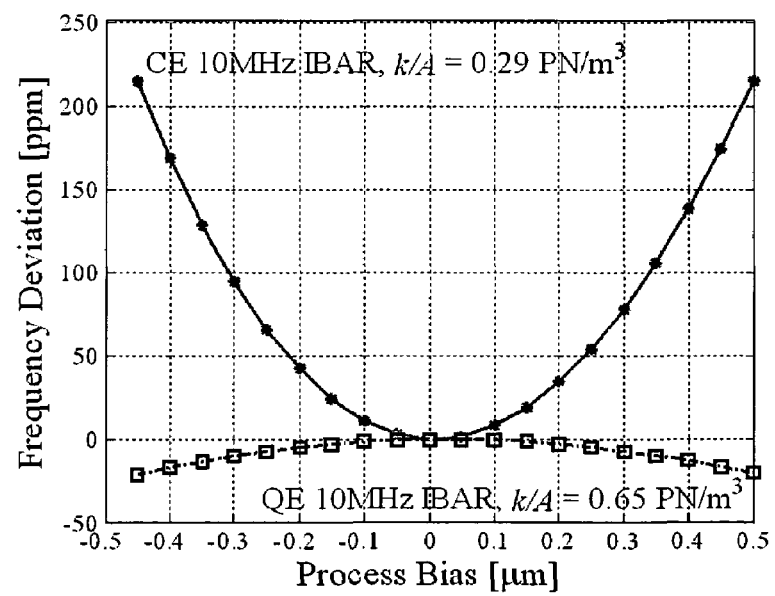
FIG. 6 is a graph that illustrates simulated $f_n$ variation of 10 MHz QE and CE IBARs for δ=[−0.5,0.5]μm.

The result may be verified using finite element analysis. The geometry for a 10 MHz resonator was obtained using the mechanical properties of single crystal silicon. The $L_f/L_r$ ratio is 6.1. As is shown in FIG. 6, frequency variations due to ±0.5 μm process bias were simulated to be [−25, 0]ppm.

Compliance-Enhanced (CE) IBAR DFM

A compliance-enhanced (CE) IBAR has greatest contribution from the flexural component (flanges). Therefore, to compensate for processing variations in a compliance-enhanced (CE) IBAR, the flexural component (flanges) must be compensated. It can be shown that a tapered clamped-free beam (rod) can be process compensated.

A process compensated 10 MHz compliance-enhanced (CE) IBAR 10 incorporating tapered flanges 12 for compensation is shown in FIG. 5b. The variation in its natural frequency is 220 ppm for a process bias of ±−0.5 μm and the curvature of the frequency sensitivity is positive, as shown in FIG. 6. When compared to the 10 MHz Q-enhanced (QE) IBAR 10, the absolute frequency variation is increased because the tip of the tapered flange 12 is relatively small.

Optimized 10 MHz Semi-compliant High-Q (CQ) IBAR DFM

In the design of the Q-enhanced (QE) IBAR 10, normalized stiffness is high and therefore motional resistance is high and tuning is reduced. In the design of the compliance-enhanced (CE) IBAR, the area and compliance are much greater, but a small feature is required for compensation. To optimize, both compensation techniques are used in a semi-compliant high-Q (CQ) IBAR 10 which has both extensional and tapered flexural contributions to the mode shape.

Figure 7:
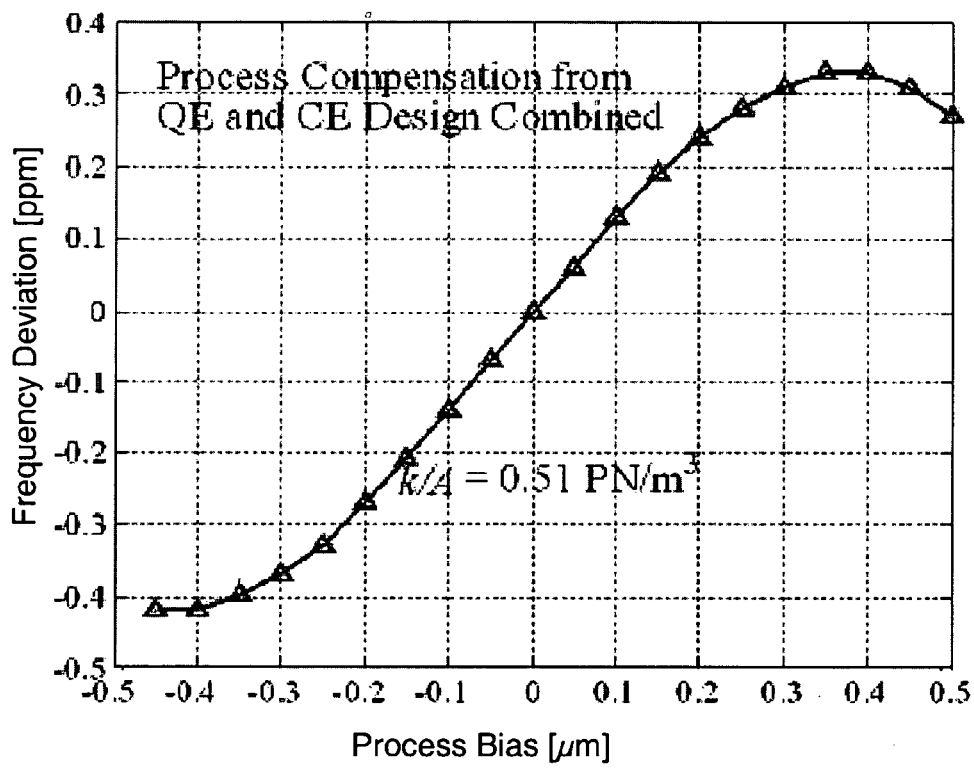
FIG. 7 is a graph that illustrates the natural frequency dependency of a 10 MHz optimized IBAR on process bias δ.

This methodology was used to fabricate a 10 MHz 10 μm thick semi-compliant high-Q (CQ) IBAR 10 shown in FIG. 2. Tapering in the flange 12 is reduced and partial extension of the rod 11 is present in the mode. Thus, both forms of compensation are in effect. The variation in $f_n$ is ±0.4 ppm over a processing window of ±0.5 μm, as shown in FIG. 7.

A disk or extensional resonator is an excellent basis for comparison since its dimensions are the largest for a given frequency. Since the natural frequency of an extensional resonator is $f_n = nv_a(2L)^{-1}$, the frequency-sensitivity is $$\frac{df/f_n}{dL} = -\frac{2f_n}{nv_a}, \tag{2}$$

where the acoustic velocity $v_a$ is ~8500 m/s along <110>. A fundamental extensional mode resonator at 10 MHz will have a frequency variation of 2400 ppm for dL=1 μm. Therefore, Q-enhanced (QE) and semi-compliant high-Q (CQ) IBARs 10 are at least a factor of 100 less sensitive to process bias. The frequency dependence on thickness if the IBAR 10 was also simulated using finite element analysis. For a thickness variation of ±1 μm, the $f_n$ variation is ~46 ppm.

Experimentation

To verify the optimized design, dimensional variations due to process bias was replicated using e-beam lithography. Three designs were drawn: a nominal 10 MHz semi-compliant high-Q (CQ) IBAR 10 with ideal geometry, one with −0.5 μm bias, and one with +0.5 μm bias. Devices were fabricated on a 10 μm n-type 0.002 Ω-cm SOI substrate 15, as shown in FIG. 2. 400 nm capacitive gaps 17, 18 were dry etched in a Surface Technology Systems Limited etching tool, and released in 49% HF solution. No steps were taken to reduce roughness. This described process is another embodiment to form resonator 10.

Figure 8:
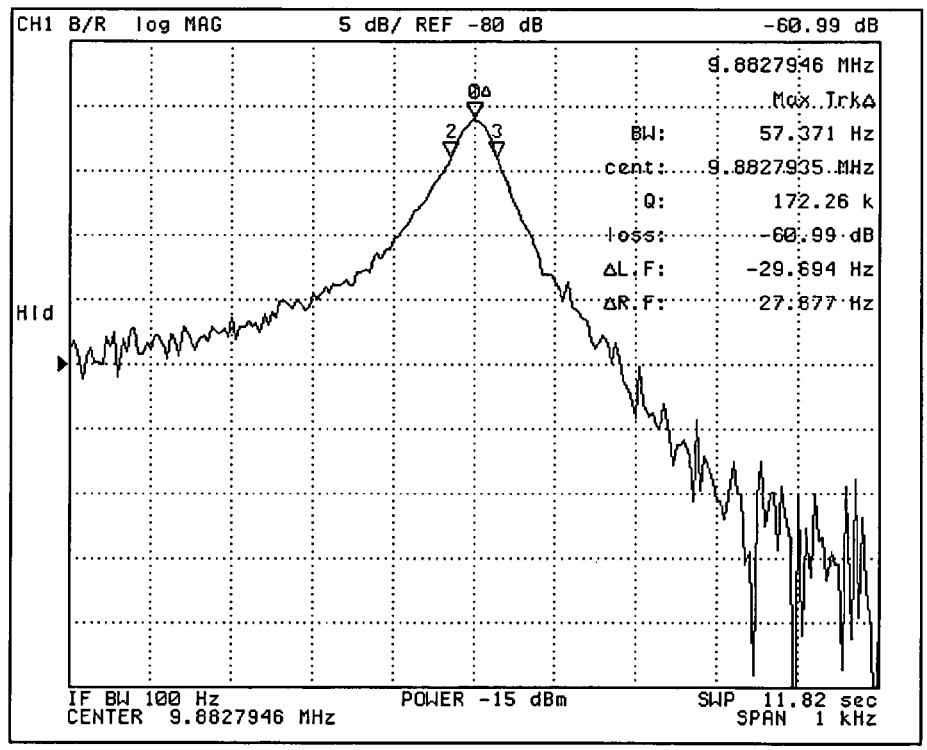
FIG. 8 is a graph that illustrates typical frequency response from the optimized 10 MHz IBAR with $V_P$=25V and P=5 Torr.

The experimental setup included an Agilent 4395A network analyzer and a vacuum chamber. The typical frequency response from an IBAR 10 is shown in FIG. 8 had an impressive quality factor of 170000 in low vacuum (5 Torr). Some resonators 10 were tested in high vacuum, at which the quality factors exceeded 250000. A polarization voltage of 25V was applied to all resonators 10.

The measured frequency variation across 41 resonators 10 was within ±250 ppm as shown in FIG. 9. The frequency variations are dispersed. However, less than 25 ppm variation was observed in the mean frequencies of the three designs. Thus, the ±250 ppm variation can be attributed to random variations.

Histograms of center frequency and Q are shown in FIGS. 10 and 11, respectively. The mean frequency from the 41 samples is 9.884 MHz. Inaccuracies in the material properties are the cause of the 1.2% frequency error. In practice, characterized substrates and precision tools to align to crystal axes are available. The elasticity coefficients and mass density are doping-dependant and are generally known within a few hundred ppm. Oxidation or hydrogen annealing of the IBARs 10 reduces random frequency variations and yields measurement accuracy of ~10 ppm and theoretical limits. Data from resonators 10 having a Q lower than 130000 were discarded due to cleanliness since particles on the surfaces also load the frequency. Measurement data from all other resonators are reported.

Process Compensation of CE IBARs

As discussed above, a IBAR is a coupled resonator having an extensional member and at least one flexural member that can be modeled as a two degree-of-freedom system. It was demonstrated through simulation that an IBAR can be processed compensated. However, the previous geometry was not compliance-enhanced (i.e., not tunable).

For the compliance-enhanced IBAR 10, the modal displacement $y_B$ of the flexural component 12 is significantly greater than the modal displacement $y_A$ of the extensional part. According to Dunkerley's formula, $$\frac{1}{\omega^2} = \sum_i \frac{1}{\omega_i^2} \quad (3)$$

in which $\omega$ is the resonance frequency of the combined system, and $\omega_i$ are the resonance frequencies of the individual components, the resonance frequency of the flexural component 12 predominantly defined the fundamental resonance frequency of the compliance-enhanced IBAR 10. Thus, in order to process compensate a compliance-enhanced IBAR 10, process compensation must be enabled in the flexural component 12 (or beam).

Uniform beams, in which the cross-section is constant along the length, cannot be process compensated. Without going into mathematical detail, a tapered beam (flexural component 12) can be process compensated.

With this established, compliance-enhanced IBARs 10 can be process compensated.

The above-disclosed design for manufacturability (DFM) technique for mechanical process compensation enables fabrication of IBARs 10 with repeatable intra- and inter-run frequencies. The disclosed approach defines process bias (CD variation) windows for silicon micromachining to obtain a center frequency within acceptable tolerances. Resonators 10 with features for process compensation have been disclosed that may be used as low-power temperature-stable frequency references. Repeatable high quality factors and resonator frequencies have been demonstrated.

Thus, improved micromechanical tapered I-shaped bulk acoustic resonators have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Micromechanical resonator apparatus, comprising:
   a substrate; and
   resonator apparatus comprising:
   one or more anchors connected to the substrate;
   at least one input/output electrode that is electrically insulated from the substrate; and
   a resonator comprising an extensional member coupled to the anchor and separated from the substrate, and a plurality of tapered flexural members connected to the extensional member that are separated from the substrate and separated from the electrode by capacitive gaps.

2. The apparatus recited in claim 1 wherein the plurality of tapered flexural members are separated from the at least one input/output electrode by a gap.

3. The apparatus recited in claim 1 wherein width and length dimensions of the tapered flexural member and the extensional member are controlled so that the stiffness-to-mass ratio of the resonator is substantially independent of processing variations.

4. The apparatus recited in claim 1 wherein the resonator apparatus further comprises:
   at least one additional input/output electrode that is electrically insulated from the substrate, and is disposed on an opposite side of the flexural member from the at least one electrode, and is separated from the at least one tapered flexural member by a gap.

* * * * *